(12) United States Patent
Chang et al.

(10) Patent No.: US 11,152,315 B2
(45) Date of Patent: Oct. 19, 2021

(54) ELECTRONIC DEVICE PACKAGE AND METHOD FOR MANUFACTURING THE SAME

(71) Applicant: Advanced Semiconductor Engineering, Inc., Kaohsiung (TW)

(72) Inventors: Wei-Tung Chang, Kaohsiung (TW); Cheng-Nan Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/653,644

(22) Filed: Oct. 15, 2019

(65) Prior Publication Data
US 2021/0111134 A1 Apr. 15, 2021

(51) Int. Cl.
| | |
|---|---|
| *H01L 23/66* | (2006.01) |
| *H01L 23/31* | (2006.01) |
| *H01L 23/29* | (2006.01) |
| *H01L 23/498* | (2006.01) |

(52) U.S. Cl.
CPC ............ *H01L 23/66* (2013.01); *H01L 23/29* (2013.01); *H01L 23/3107* (2013.01); *H01L 23/49816* (2013.01); *H01L 2223/6677* (2013.01)

(58) Field of Classification Search
CPC ..... H01L 23/66; H01L 23/29; H01L 23/3107; H01L 23/49816
See application file for complete search history.

(56) References Cited

U.S. PATENT DOCUMENTS

| | | | | |
|---|---|---|---|---|
| 5,414,928 | A * | 5/1995 | Bonitz | H05K 3/3421 29/840 |
| 8,648,454 | B2 | 2/2014 | Liu et al. | |
| 2002/0185717 | A1* | 12/2002 | Eghan | H01L 23/055 257/678 |
| 2010/0171206 | A1* | 7/2010 | Chu | H01L 23/49816 257/686 |
| 2013/0189935 | A1* | 7/2013 | Nair | H01Q 1/2283 455/90.2 |
| 2015/0187734 | A1* | 7/2015 | Liu | H01L 25/0657 257/621 |
| 2016/0027712 | A1* | 1/2016 | Hu | H01L 23/562 174/262 |
| 2019/0304936 | A1* | 10/2019 | Shaul | H01L 25/16 |

* cited by examiner

*Primary Examiner* — Peniel M Gumedzoe
(74) *Attorney, Agent, or Firm* — Foley & Lardner LLP

(57) ABSTRACT

An electronic device package includes a first conductive substrate, a second conductive substrate and a dielectric layer. The first conductive substrate has a first coefficient of thermal expansion (CTE). The second conductive substrate is disposed on an upper surface of the first conductive substrate and electrically connected to the first conductive substrate. The second conductive substrate has a second CTE. The dielectric layer is disposed on the upper surface of the first conductive substrate and disposed on at least one sidewall of the second conductive substrate. The dielectric layer has a third CTE. A difference between the first CTE and the second CTE is larger than a difference between the first CTE and the third CTE.

19 Claims, 15 Drawing Sheets

ELECTRONIC DEVICE PACKAGE AND METHOD FOR MANUFACTURING THE SAME

BACKGROUND

1. Technical Field

The present disclosure relates to an electronic device package and a method for manufacturing the same, and more particularly to an electronic device package including a stack of pair conductive substrates and a dielectric layer alongside the pair of conductive substrates having matching coefficient of thermal expansion (CTE) and a method for manufacturing the same.

2. Description of the Related Art

Wireless communication devices, such as smart phones, typically include antennas for transmitting and receiving radio frequency (RF) signals. A wireless communication device normally includes an antenna substrate and a communication substrate. The antenna substrate and the communication substrate have different functional specifications. For example, the dielectric layer(s) of the antenna substrate specify relatively low dielectric constant (Dk) and relatively low dissipation factor (Df) to obtain desired peak gain and thinner thickness, while the dielectric layer(s) of the communication substrate specify relatively high dielectric constant (Dk). In pursuit of low Dk and Df characteristics, the modulus of elasticity and adhesion properties of the dielectric layer(s) in the antenna substrate are accordingly reduced, which deteriorates the robustness of the wireless communication device and the adhesion between the antenna substrate and the communication substrate.

SUMMARY

In some embodiments, an electronic device package includes a first conductive substrate, a second conductive substrate and a dielectric layer. The first conductive substrate has a first coefficient of thermal expansion (CTE). The second conductive substrate is disposed on an upper surface of the first conductive substrate and electrically connected to the first conductive substrate. The second conductive substrate has a second CTE. The dielectric layer is disposed on the upper surface of the first conductive substrate and disposed on at least one sidewall of the second conductive substrate. The dielectric layer has a third CTE. A difference between the first CTE and the second CTE is larger than a difference between the first CTE and the third CTE.

In some embodiments, an antenna device package includes a substrate, at least one first antenna structure, a dielectric layer and an electronic component. The substrate has a first surface and a second surface opposite to the first surface. The at least one first antenna structure is disposed on the first surface of the substrate. A space is defined between the first surface of the substrate and a sidewall of the first antenna structure, and the space exposes a portion of the first surface of the substrate. The dielectric layer is disposed in the space and in contact with the sidewall of the first antenna structure and the first surface of the substrate. The electronic component is disposed on the second surface of the substrate and electrically connecting with the first antenna structure through the substrate.

In some embodiments, a method for manufacturing an electronic device package includes the following operations. A substrate is received. A plurality of antenna structures are formed on the substrate. A dielectric layer is formed on the substrate to encapsulate the antenna structures.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
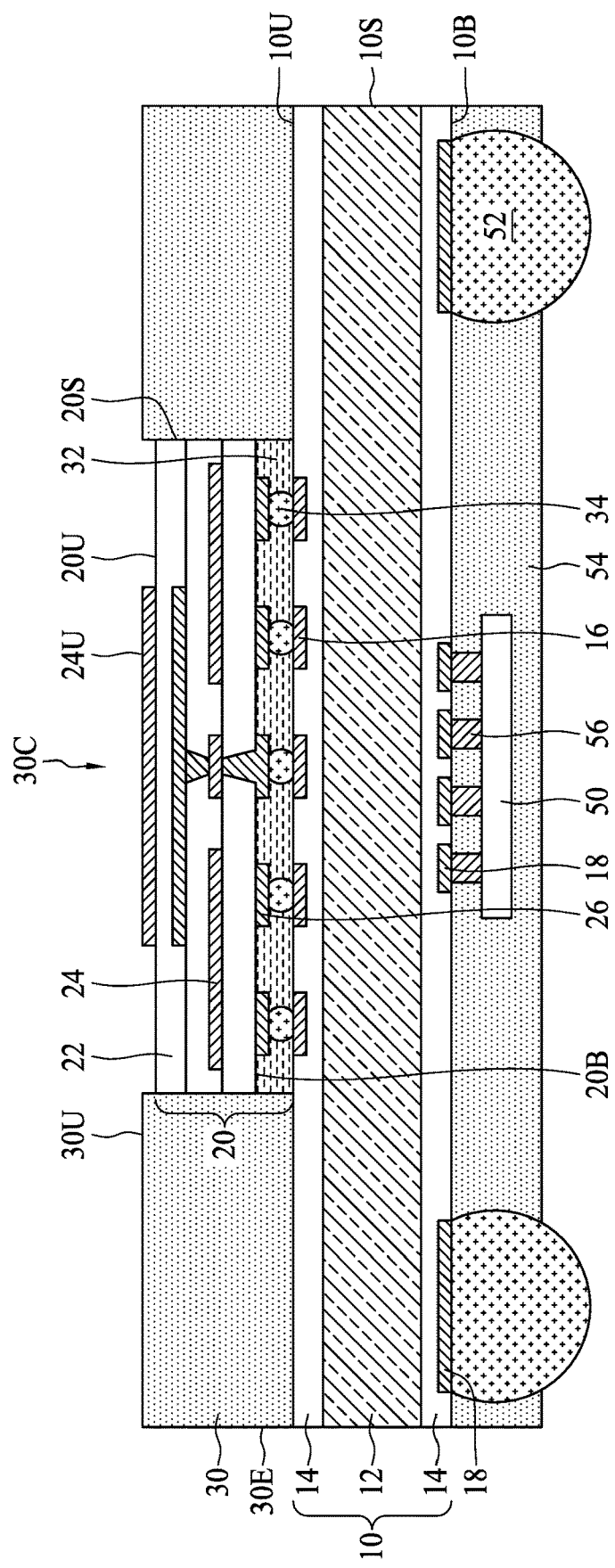
FIG. 1 is a cross-sectional view of an electronic device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In some embodiments of the present disclosure, an electronic device package and a method of manufacturing the same are provided. The electronic device package may include, but is not limited to, an antenna device package. The electronic device package may include any electronic device package including a stack of two heterogeneous substrates or two heterogeneous structures having different material characteristics such as coefficient of thermal expansion (CTE), modulus of elasticity (Young's modulus), dielectric constant (Dk), and dissipation factor (Df).

Figure 1A:
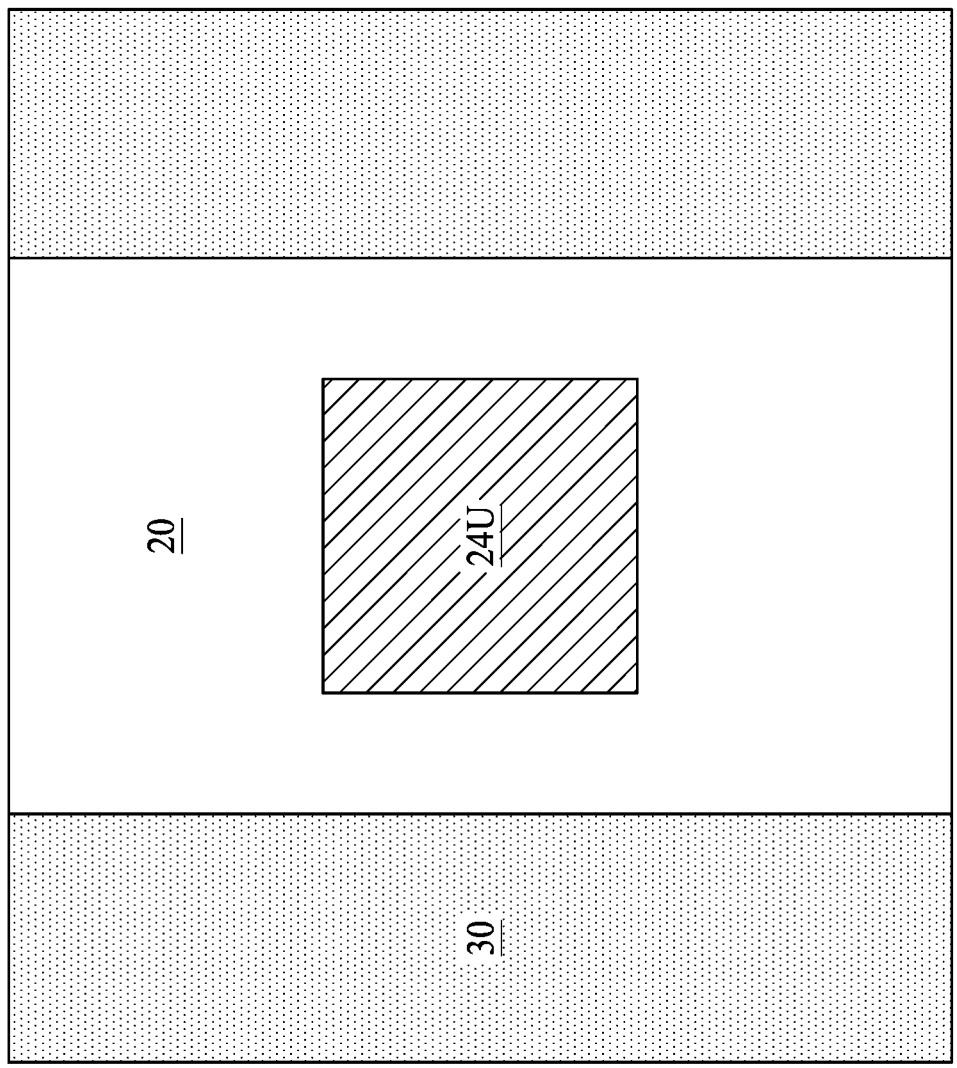
FIG. 1A is a top view of an electronic device package of FIG. 1 in accordance with some embodiments of the present disclosure.

FIG. 1 is a cross-sectional view of an electronic device package 1 in accordance with some embodiments of the present disclosure, and FIG. 1A is a top view of an electronic device package 1 of FIG. 1 in accordance with some embodiments of the present disclosure. As shown in FIG. 1 and FIG. 1A, the electronic device package 1 includes a first conductive substrate 10, a second conductive substrate 20 and a dielectric layer 30. The electronic device package 1 may include, but is not limited to, an antenna device package. The first conductive substrate 10 has a first coefficient of thermal expansion (CTE), and a first modulus of elasticity. The first conductive substrate 10 may also be referred to as a substrate, a communication substrate, or the like. The first conductive substrate 10 may be a multi-layered substrate. For example, the first conductive substrate 10 may be a core substrate including a core layer 12, a plurality of dielectric films 14 disposed on opposite sides of the core layer 12. The material of the dielectric films 14 may individually include organic material. Circuit layer(s) may be formed in and/or between the core layer 12 and the dielectric film 14. The circuit layer may include first bonding pads 16 exposed from an upper surface 10U, and second bonding pads 18 exposed from a lower surface 10B. In some other embodiments, the first conductive substrate 10 may include a core-less substrate, a semiconductor substrate or another type of substrate.

The second conductive substrate 20 is disposed on the upper surface 10U of the first conductive substrate 10 and electrically connected to the first conductive substrate 10. The second conductive substrate 20 may be a pre-formed structure, and attached to the upper surface 10U of the first conductive substrate 10 with an adhesion layer 32, and electrically connected to the first conductive substrate 10 with a plurality of conductive structures 34. The conductive structures 34 may include solder conductive structures such as solder bumps or solder ball, or non-solder conductive structures such as copper pillar, or a combination thereof. The second conductive substrate 20 and the first conductive substrate 10 are electrically connected through the conductive structures 34. Compared to wire bonding, the conductive structures 34 disposed between the first conductive substrate 10 and the second conductive substrate 20 do not affect antenna performance and do not require additional mold for covering bonding wires. The second conductive substrate has a second CTE, and a second modulus of elasticity. In some embodiments, the first conductive substrate 10 may be more rigid than the second conductive substrate 20, and thus the first modulus of elasticity of the first conductive substrate 10 is larger than the second modulus of elasticity of the second conductive substrate 20. In some embodiments, the ratio of the first modulus of elasticity of the first conductive substrate 10 to the second modulus of elasticity of the second conductive substrate 20 is greater than about 1.5 or about 2. In some embodiments, the adhesion layer 32 is softer than the first conductive substrate 10 and the second conductive substrate 20, and thus a modulus of elasticity of the adhesion layer 32 is lower than the first modulus of elasticity and the second modulus of elasticity. The dimension e.g., length and/or width of the second conductive substrate 20 is smaller than that of the first conductive substrate 10, and a portion of the upper surface 10U of the first conductive substrate 10 is exposed by the second conductive substrate 20. The second conductive substrate 20 may include a plurality of dielectric films 22 and a plurality of conductive layers 24 alternately stacked on one another. The material of the dielectric films 22 may individually include organic material. The conductive layers 24 may be electrically connected to one another, or electrically coupled to one another. The second conductive substrate 20 may further include bonding pads 26 electrically connected to the conductive layers 24 and exposed from a bottom surface 20. In some embodiments, an upmost conductive layer 24U may be exposed from an upper surface 20U of the second conductive substrate 20. In some embodiments, the second conductive substrate 20 may be configured as an antenna structure. By way of example, the second conductive substrate 20 may include a multi-band antenna structure, and the upmost conductive layer 24U may be a patch antenna. The second conductive substrate 20 may be referred to as an antenna structure or a first antenna structure. The material of the conductive layers 24 and the bonding pads 26 may individually include metal such as copper (Cu), aluminum (Al), silver (Ag), an alloy thereof, or the like.

The core layer 12/dielectric films 14, the dielectric films 22 and the adhesion layer 32 may be heterogeneous materials and have different properties. For example, the dielectric constant (Dk) of the dielectric films 22 may range from about 2.8 to about 3.4 at a frequency of about 10 GHz, and is about 2.3 at a frequency of about 60 GHz. The dielectric constant (Dk) of the core layer 12 and/or dielectric films 14 may range from about 3.4 to about 3.5 at a frequency of about 10 GHz. The dielectric constant (Dk) of the adhesion layer 30 may be about 3.1 at a frequency of about 10 GHz, and about 2.3 at a frequency of about 60 GHz. The dissipation factor (Df) of the core layer 12 and/or dielectric films 14 ranges from about 0.0016 to about 0.0128 at a frequency of about 10 GHz, and is about 0.0009 at a frequency of about 10 GHz. The dissipation factor (Df) of the dielectric films 22 ranges from about 0.004 to about 0.005 at a frequency of about 10 GHz. The dissipation factor (Df) of the adhesion layer 32 may range from about 0.0016 to about 0.0128 at a frequency of about 10 GHz, or is about 0.0009 at a frequency of about 60 GHz. The CTE of the dielectric films 22 may range from about 19 to about 110. The CTE of the core layer 12 and/or dielectric films 14 may range from about 11 to about 13. The CTE of the adhesion layer 32 may range from about 70 to about 110. The modulus of the dielectric films 22 may range from about 0.4 GPa to about 13 GPa. The modulus of elasticity of the core layer 12/dielectric films 14 may range from about 25 GPa to about 26 GPa. The modulus of the adhesion layer 32 may range from about 0.4 GPa to about 0.75 GPa.

In some embodiments, the electronic device package 1 may further include an electronic component 50 disposed on the lower surface 10B of the first conductive substrate 10, and electrically connected to the first conductive substrate 10 and the second conductive substrate 20 through a portion of the second bonding pads 18 and a plurality of conductive structures 56. The conductive structures 56 may include solder conductive structures such as solder bumps or solder ball, or non-solder conductive structures such as copper pillar, or a combination thereof, for example. The electronic component 50 may include active component such as semiconductor die, passive component, or a combination thereof. In some embodiments, the electronic component 50 may include an RFIC (radio frequency integrated circuit). In some embodiments, the electronic device package 1 may further include a plurality of electrical contacts 52 disposed on the lower surface 10B of the first conductive substrate 10, and electrically connected to the first conductive substrate 10 through another portion of the second bonding pads 18, for example. The electronic device package 1 can be electrically connected to an external electronic component such as a printed circuit board (PCB) through the electrical contacts 52. The electrical contacts 52 may include solder balls or the like. The electronic component 50 is disposed on the lower surface 10B of the first conductive substrate 10 and near the PCB, and thus heat dissipation path is shortened.

In some embodiments, the electronic device package 1 may further include an encapsulation layer 54 disposed on the lower surface 10B of the first conductive substrate 10, and encapsulating the electronic component 50. The material of the encapsulation layer 54 may include molding compound. The encapsulation layer 54 and the dielectric layer 30 may include the same material or different materials.

The dielectric layer 30 is disposed on the upper surface 10U of the first conductive substrate 10, and disposed on at least one sidewall 20S of the second conductive substrate 20. The dielectric layer 30 has a third CTE and a third modulus of elasticity. In some embodiments, a space S is defined between the upper surface 10U of the first conductive substrate 10 and a sidewall 20S of the second conductive substrate 20, and exposes a portion of the upper surface 10U of the first conductive substrate 10. The dielectric layer 30 is disposed in the space S and may be in contact with the upper surface 10U of the first conductive substrate 10 and the sidewall 20S of the second conductive substrate 20. In some embodiments, the dielectric layer 30 may surrounds the sidewalls 20S of the second conductive substrate 20 as shown in FIG. 1A. For example, the dielectric layer 30 includes a cavity 30C, and the second conductive substrate 20 is disposed in the cavity 30C. In some embodiments, the dielectric layer 30 may be arranged symmetrically with respect to the second conductive substrate 20. In some embodiments, the upper surface 20U of the second conductive substrate 20 may be lower than the upper surface 30U of the dielectric layer 30. In some other embodiments, the upper surface 20U of the second conductive substrate 20 may be substantially coplanar with or higher than the upper surface 30U of the dielectric layer 30. The edge 30E of the dielectric layer 30 may be substantially coplanar with the sidewall 10S of the first conductive substrate 10. In some embodiment, the material of the dielectric layer 30 may include molding compound such epoxy resin, and fillers such as silicon oxide fillers may be filled in the molding compound.

The materials of the first conductive substrate 10, the second conductive substrate 20 and the dielectric layer 30 are selected such that the first CTE of the first conductive substrate 10, the second CTE of the second conductive substrate 20 and the third CTE of the dielectric layer 30 are matched. By way of example, the difference between the first CTE and the second CTE is larger than the difference between the first CTE and the third CTE, namely, the third CTE is closer to the first CTE than to the second CTE. The dielectric layer 30 may include low Dk and low Df material. The third modulus of elasticity of the dielectric layer 30 may be between the first modulus of elasticity of the first conductive substrate 10 and the second modulus of elasticity of the second conductive substrate 20.

The dielectric layer 30 and the second conductive substrate 20 are both disposed on the upper surface 10U of the first conductive substrate 10. Due to the large CTE difference between the second conductive substrate 20 and the first conductive substrate 10, stress may occur resulting in warpage. The dielectric layer 30 with the third CTE close to the first CTE can help to compensate the stress, thereby alleviating the warpage. In addition, the dielectric layer 30 with the third modulus of elasticity between the first modulus of elasticity of the first conductive substrate 10 and the second modulus of elasticity of the second conductive substrate 20 may also help to withstand the deformation, thereby alleviating the warpage, avoiding delamination and increase the robustness. The material of the dielectric layer 30 is selected to be more adhesive to both the first conductive substrate 10 and the second conductive substrate 20. Accordingly, the adhesion between the dielectric layer 30 and the first conductive substrate 10 is larger than the adhesion between the second conductive substrate 20 and the first conductive substrate 10, and the adhesion between the dielectric layer 30 and the second conductive substrate 20 is larger than the adhesion between the second conductive substrate 20 and the first conductive substrate 10. Thus, the robustness of the electronic device package 1 can be further enhanced.

The electronic device packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2:
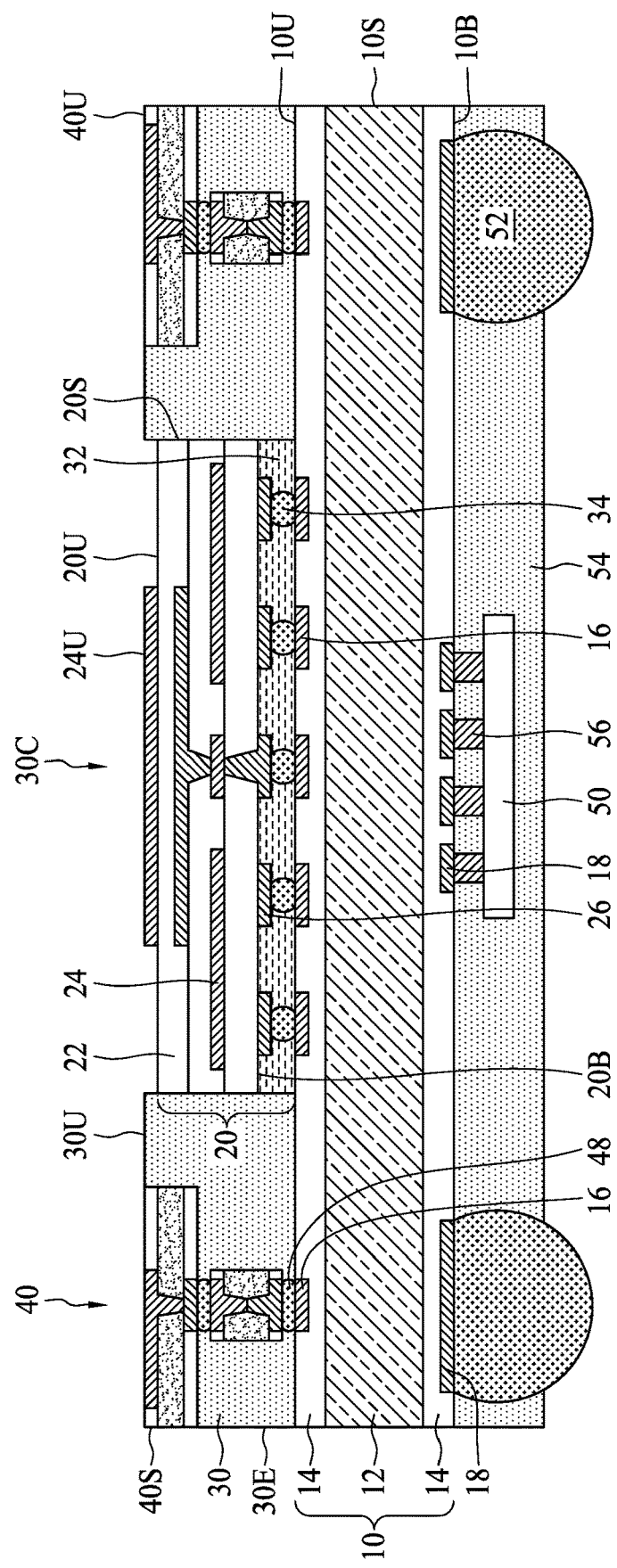
FIG. 2 is a cross-sectional view of an electronic device package in accordance with some embodiments of the present disclosure.
Figure 2A:
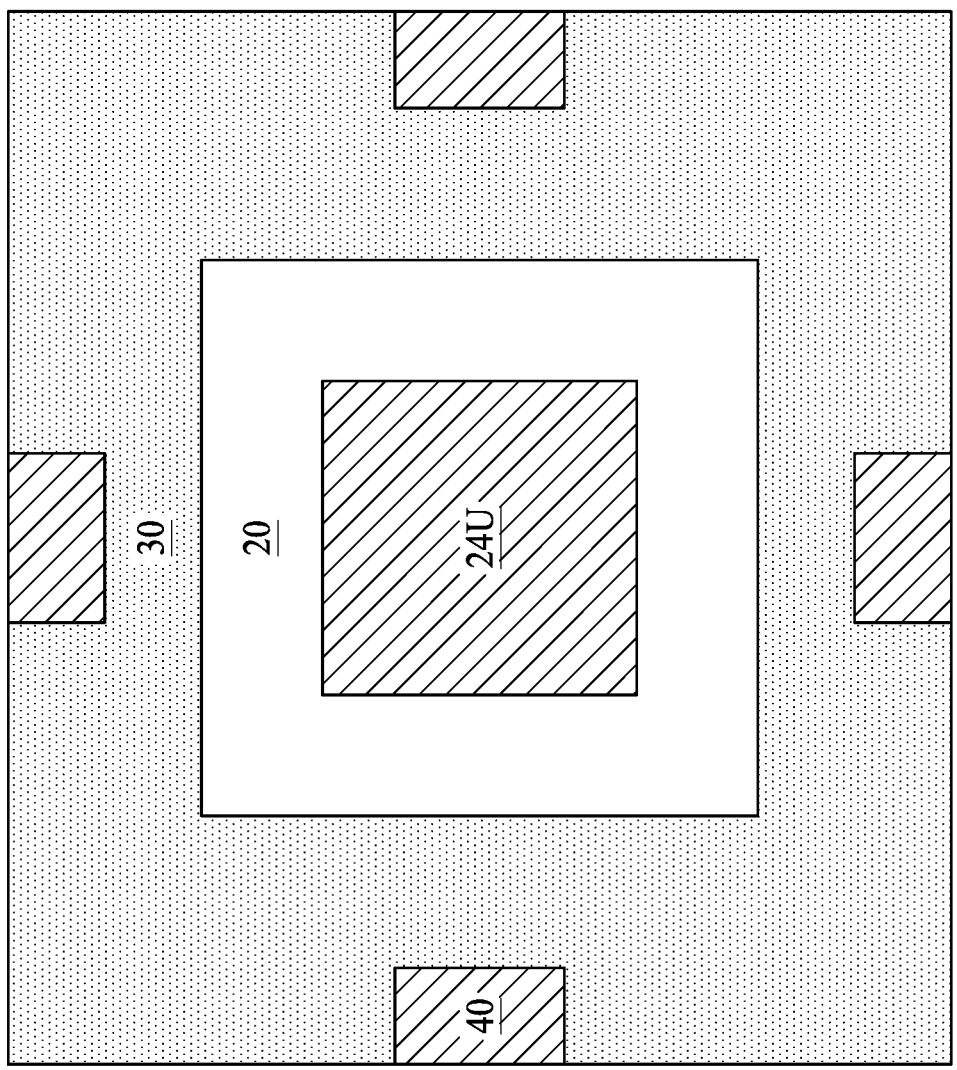
FIG. 2A is a top view of an electronic device package of FIG. 2 in accordance with some embodiments of the present disclosure.

FIG. 2 is a cross-sectional view of an electronic device package 2 in accordance with some embodiments of the present disclosure, and FIG. 2A is a top view of an electronic device package 2 of FIG. 2 in accordance with some embodiments of the present disclosure. As shown in FIG. 2 and FIG. 2A, in contrast to the electronic device package 1 in FIG. 1, the electronic device package 2 further includes at least one second antenna structure 40 disposed in the dielectric layer 30. The second antenna structure 40 may be electrically connected to a portion of the first bonding pad 16 through conductive structures 48. The conductive structures 48 may include solder bumps or the like. In some embodiments, the first antenna structure (the second conductive substrate) 20 and the second antenna structure 40 may include different types of antenna structures. By way of example, the first antenna structure 20 may include a multi-band antenna structure, and the second antenna structure 40 may include an end-fire antenna structure. The first antenna structure 20 and the second antenna structure 40 may be disposed at substantially the same level on the first conductive substrate 10. The number of the second antenna structure 40 can be modified based on communication requirement. In some embodiments, the second antenna structure 40 may include a T-shaped cross-sectional shape. An upper surface 40U of the second antenna structure 40 is exposed from the upper surface 30U of the dielectric layer 30. The upper surface 40U of the second antenna structure 40 may be substantially coplanar with the upper surface 30U of the dielectric layer 30. In some embodiments, a sidewall 40S of the second antenna structure 40 is substantially coplanar with an edge 30E of the dielectric layer 30. In some embodiments, one or more conductive layers may be embedded in the dielectric layer 30, or partially exposed from the upper surface 30U and/or the edge 30E of the dielectric layer 30. The second antenna structure 40 is disposed in the periphery region of the first conductive substrate 10, and thus no additional space is needed for accommodating the second antenna structure 40. In some embodiments, the upper surface 20U of the second conductive substrate 20 is lower than the upper surface 30U of the dielectric layer 30.

Figure 3:
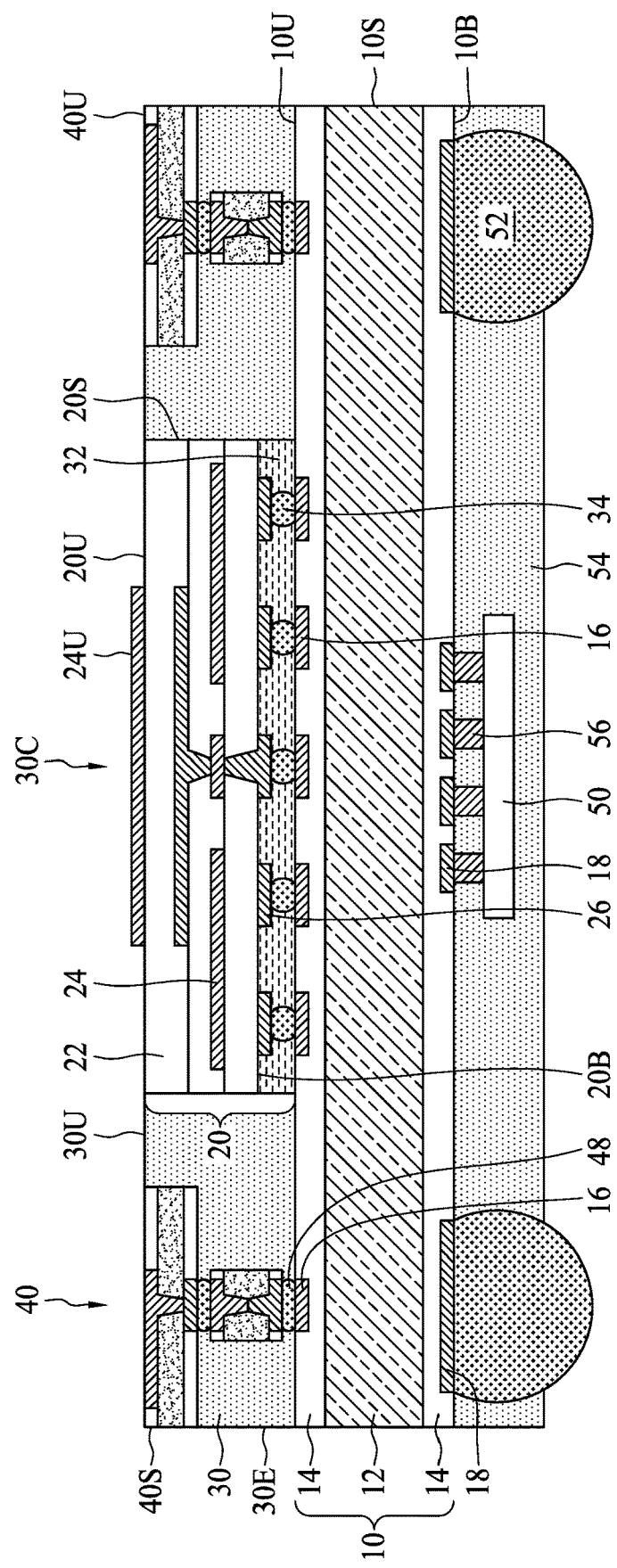
FIG. 3 is a cross-sectional view of an electronic device package in accordance with some embodiments of the present disclosure.

FIG. 3 is a cross-sectional view of an electronic device package 3 in accordance with some embodiments of the present disclosure. As shown in FIG. 3, in contrast to the electronic device package 2 in FIG. 2, the upper surface 20U of the second conductive substrate 20 is substantially coplanar with the upper surface 30U of the dielectric layer 30. The levels of the upper surface 20U and the upper surface 30U may be modified to improve the antenna performance.

Figure 4A:
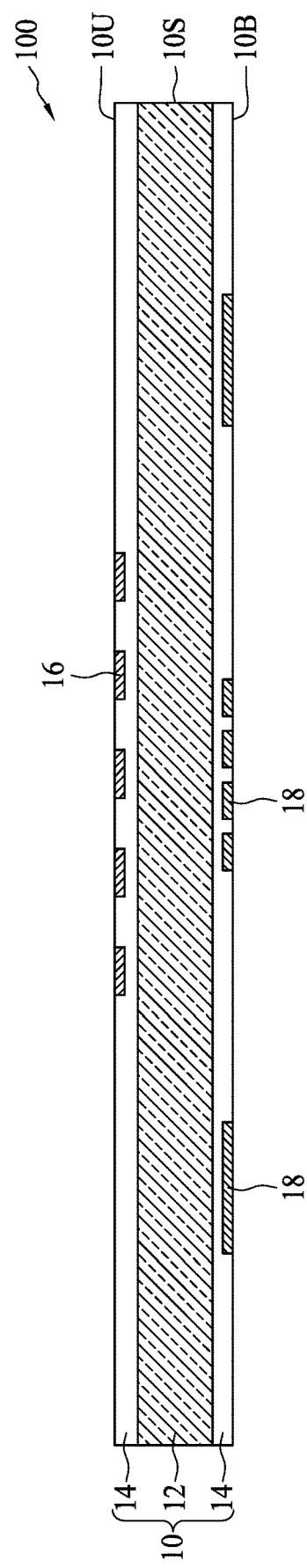
FIG. 4A, FIG. 4B, FIG. 4C, FIG. 4D, FIG. 4E, FIG. 4F and FIG. 4G illustrate operations of manufacturing an electronic device package in accordance with some embodiments of the present disclosure.
Figure 4B:
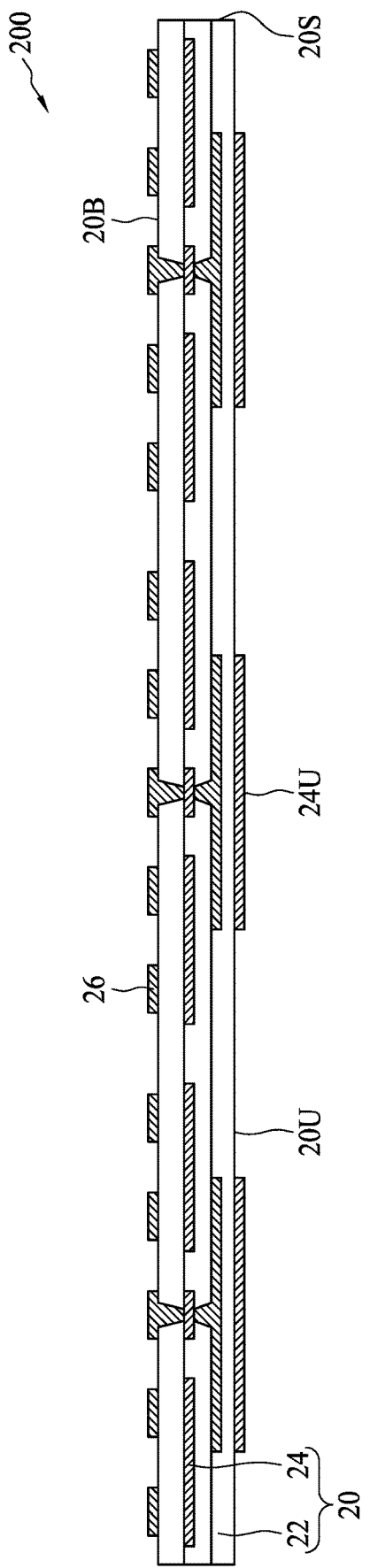
Figure 4C:
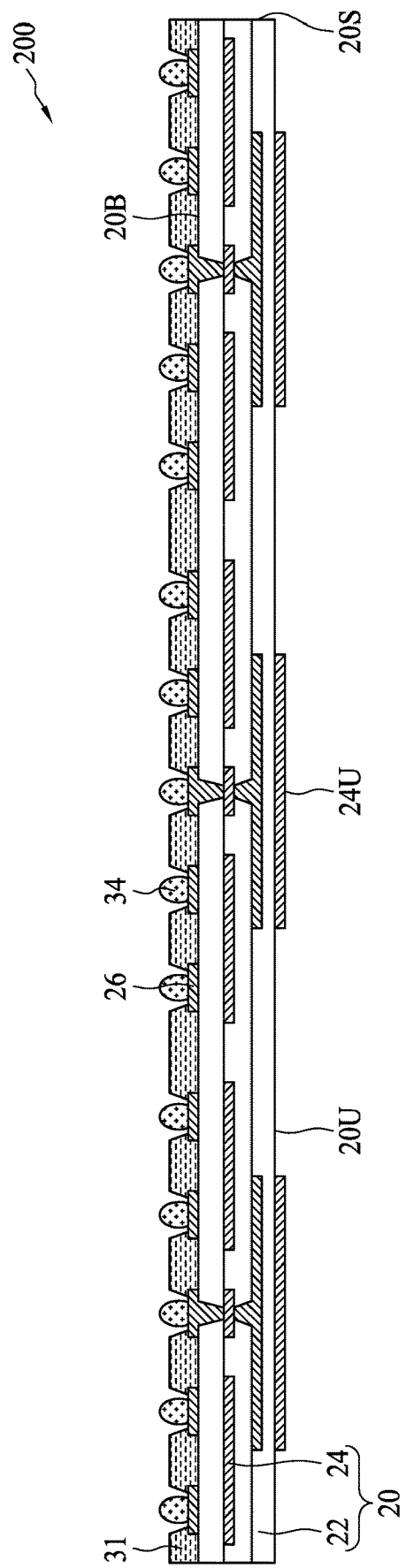

FIG. 4A, FIG. 4B, FIG. 4C, FIG. 4D, FIG. 4E, FIG. 4F and FIG. 4G illustrate operations of manufacturing an electronic device package in accordance with some embodiments of the present disclosure. As shown in FIG. 4A, a first substrate 100 is received. The substrate 100 includes a plurality of first conductive substrates 10 prior to singulation. As shown in FIG. 4B, a second substrate 200 includes a plurality of second conductive substrates 20 connected to one another. As shown in FIG. 4C, a plurality of conductive structures 34 are formed on the bonding pads 26. In some embodiments, an adhesive material 31 is formed on the second substrate 200. In some embodiments, the adhesive material 31 is partially removed by laser drill for example to expose the conductive structures 34.

Figure 4D:
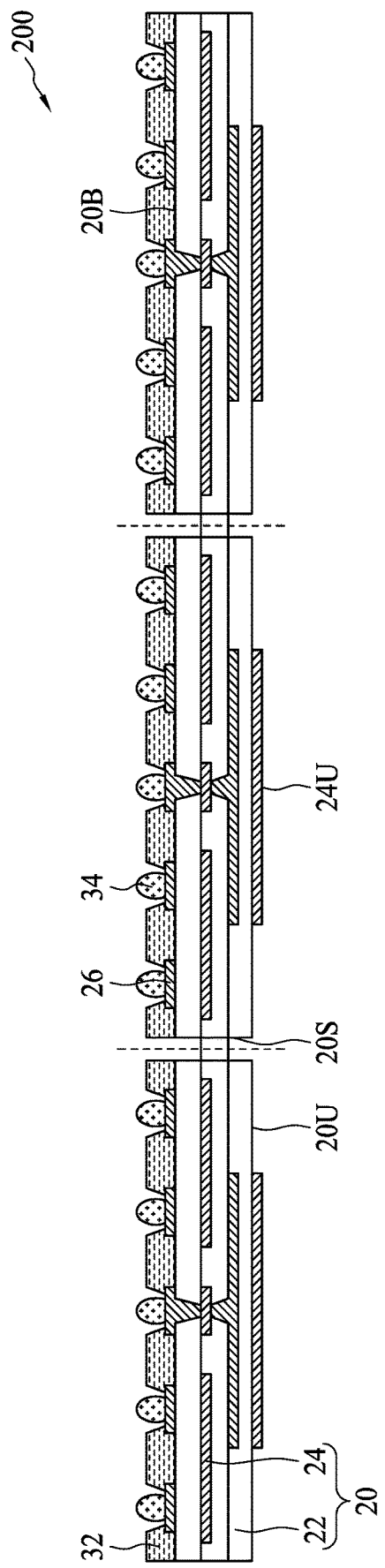
Figure 4E:
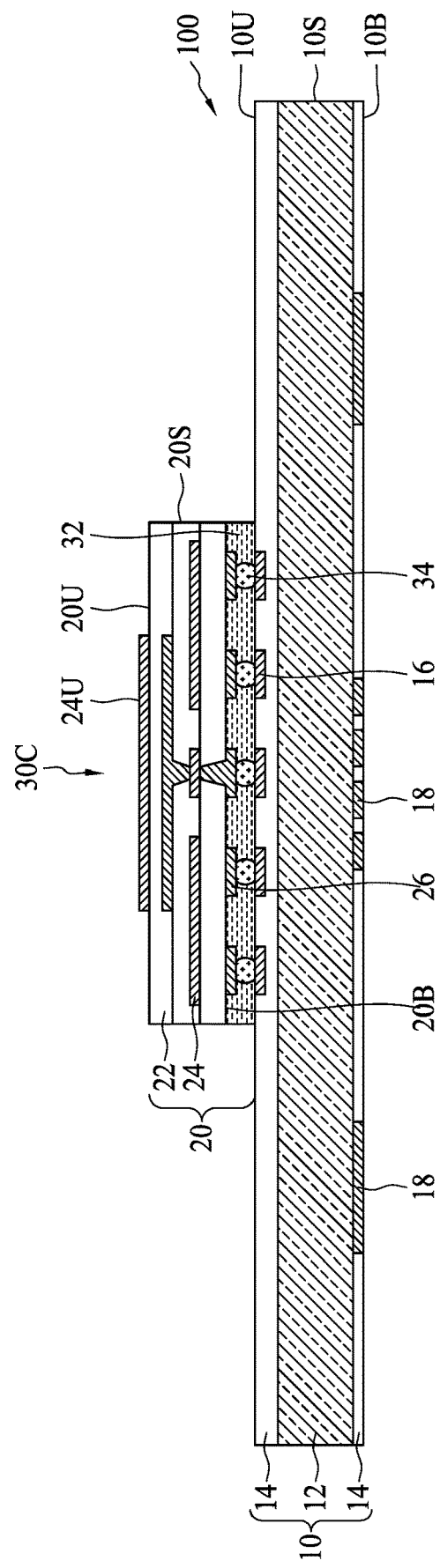
Figure 4F:
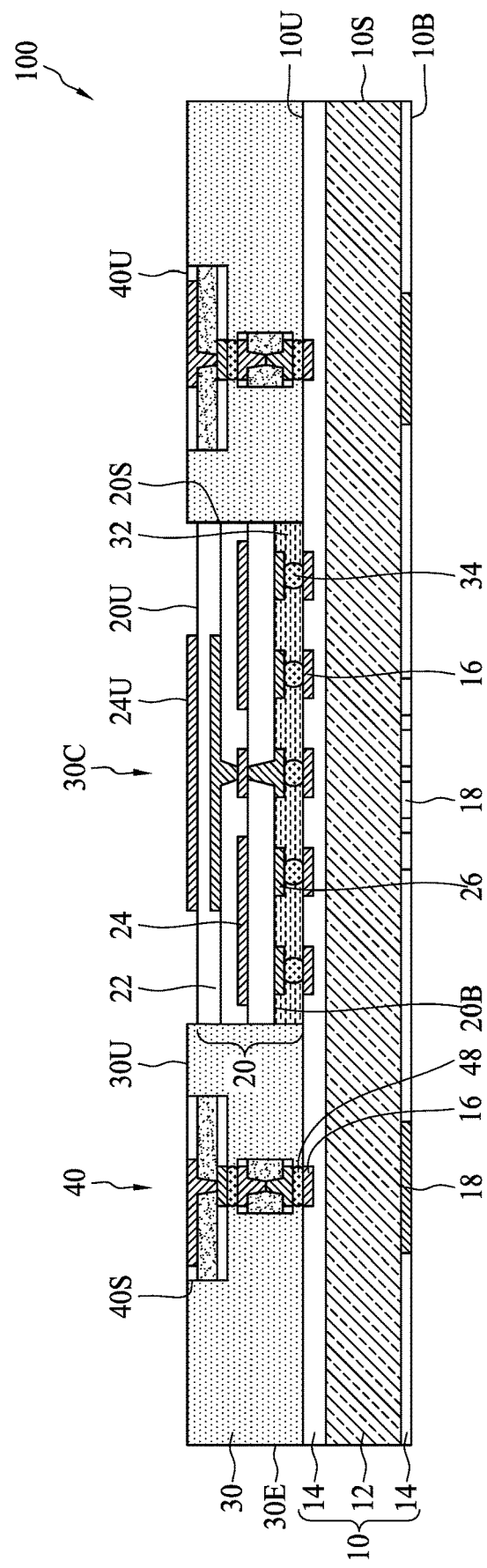

As shown in FIG. 4D, the second substrate 200 is diced to separate the second conductive substrates 20 and to divide the adhesive material 31 into a plurality of adhesion layers 32. As shown in FIG. 4E, a plurality of second conductive substrates 20 are formed on the first substrate 100. In some embodiments, the second conductive substrates 20 are electrically connected to first substrate 100 with conductive structures 34, and attached to the first substrate 100 through a plurality of adhesion layers 32, respectively. As shown in FIG. 4F, a dielectric layer 30 is formed on the first substrate 100 to encapsulate the second conductive substrates 20. In some embodiments, a plurality of second antenna structures 40 may be formed on the first substrate and adjacent to the second conductive substrates 20 prior to formation of the dielectric layer 30.

Figure 4G:
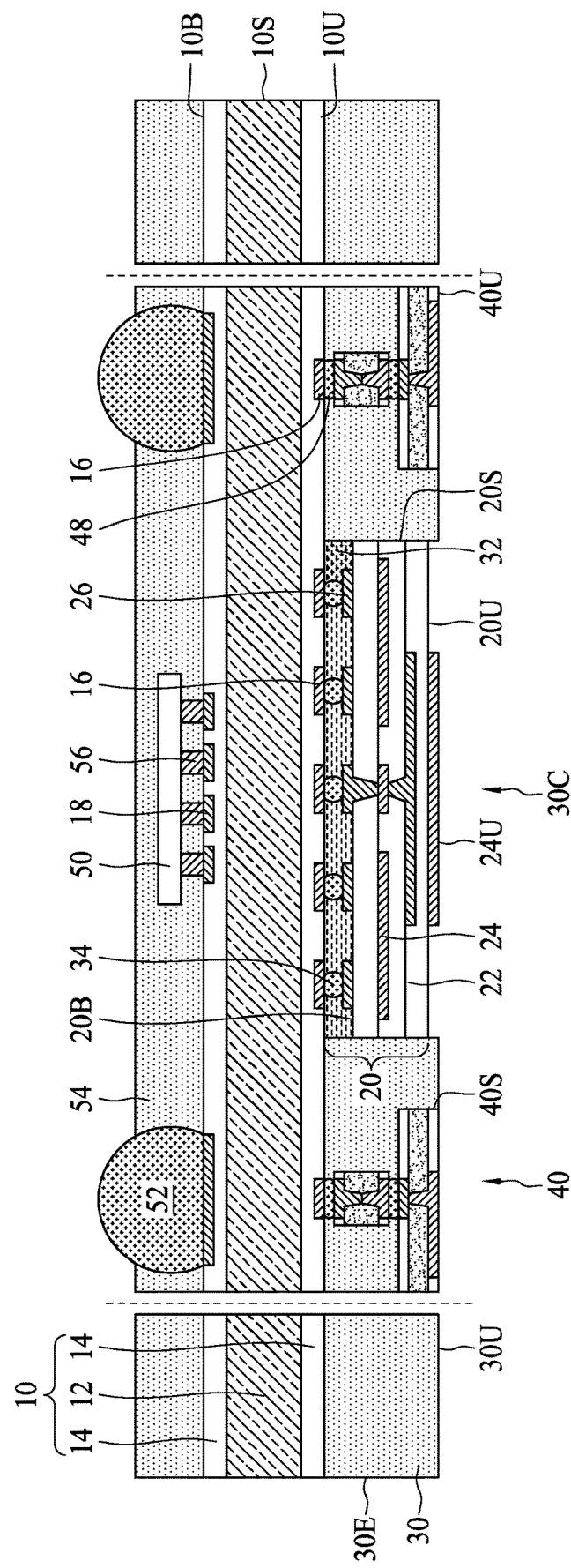

As shown in FIG. 4G, the first substrate 100 may be flipped over. A plurality of electronic components 50 may be formed on the lower surface 10B of the first substrate 100, and electrically connected to the first conductive substrate 10 through a plurality of conductive structures 56. A plurality of electrical contacts 52 such as solder balls may be formed on the lower surface 10B of the first substrate 100 and electrically connected to the first conductive substrate 10 through second bonding pads 18. An encapsulation layer 54 may be formed on the lower surface 10B of the first substrate 100 to encapsulate the electronic components 50. The first substrate 100 and the dielectric layer 30 are then diced to form the electronic device package 1, 2 or 3 as illustrated in FIG. 1, FIG. 2 or FIG. 3.

Figure 5A:
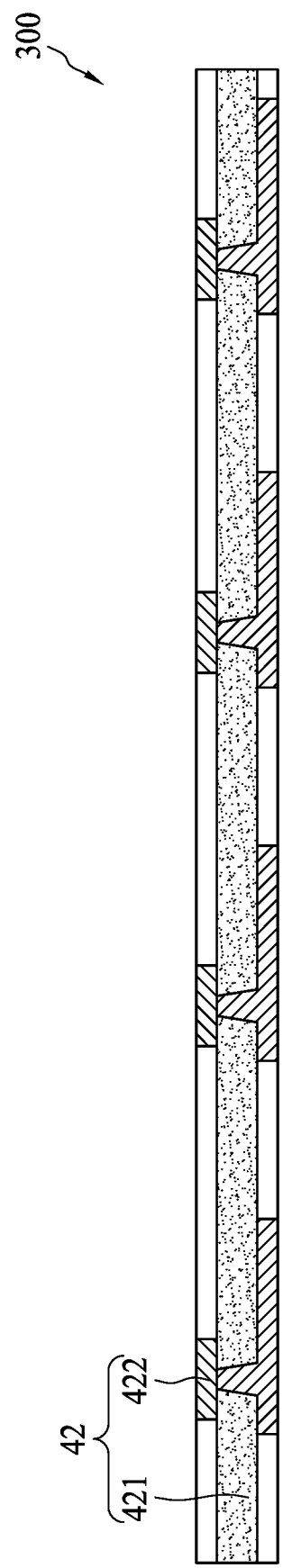
FIG. 5A, FIG. 5B and FIG. 5C illustrate operations of manufacturing an antenna structure in accordance with some embodiments of the present disclosure.
Figure 5B:
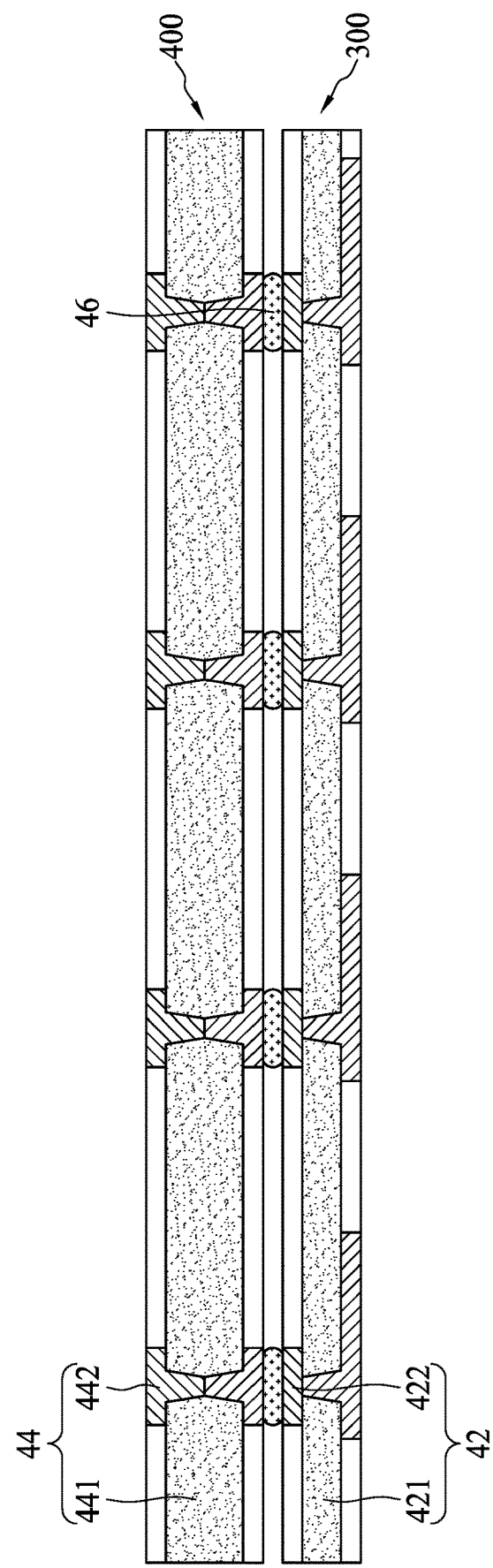
Figure 5C:
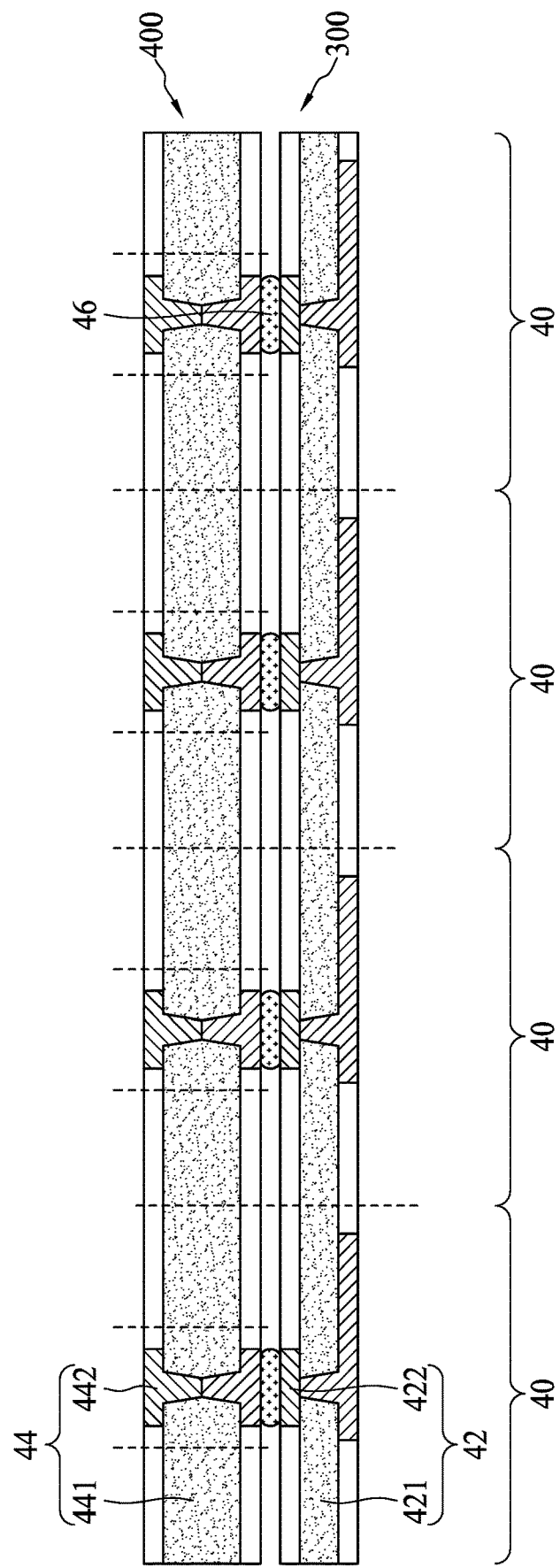

FIG. 5A, FIG. 5B and FIG. 5C illustrate operations of manufacturing an antenna structure in accordance with some embodiments of the present disclosure. As shown in FIG. 5A, a third substrate 300 is received. The third substrate 300 includes a plurality of first conductive unit 42 connected to one another. The first conductive unit 42 may be a portion of the antenna structure 40 as illustrated in FIG. 2. The third substrate 300 may include a plurality of dielectric films 421 and a plurality of conductive layers 422 alternately stacked on one another.

As shown in FIG. 5B, a fourth substrate 400 is received. The third substrate 400 includes a plurality of second conductive units 44 connected to one another. The second conductive unit 44 may be another portion of the antenna structure 40 as illustrated in FIG. 2. The fourth substrate 400 may include a plurality of dielectric films 441 and a plurality of conductive layers 442 alternately stacked on one another. The fourth substrate 400 and the third substrate 300 are bonded to each other with a plurality of conductive structures 46 such as solder bumps or the like.

As shown in FIG. 5C, the third substrate 300 and the fourth substrate 400 are diced to form a plurality of antenna structures 40. The antenna structures 40 may be formed on the first conductive substrate 10 to form the electronic device package 2 or 3 as illustrated in FIG. 2 or FIG. 3.

In some embodiments of the present disclosure, the electronic device package uses conductive structures between two conductive substrates (e.g., a communication substrate and an antenna structure) to build an electrical connection between the conductive substrates. Accordingly, the transmission path of the electrical connection can be shortened, and the overall thickness of the electronic device package can be reduced. The electronic device package includes a dielectric layer disposed in a space defined between an upper surface of the underlying conductive substrate and a sidewall of the overlying conductive substrate. The dielectric layer with a CTE close to the CTE of the underlying conductive substrate can help to compensate the stress between the pair of conductive substrates, thereby alleviating the warpage. In addition, the dielectric layer having a modulus of elasticity between that of pair of conductive substrates may help to withstand the deformation, thereby alleviating the warpage, avoiding delamination and increase the robustness. The adhesion between the dielectric layer and the underlying conductive substrate is larger than the adhesion between the overlying conductive substrate and the underlying conductive substrate, and the adhesion between the dielectric layer and the overlying conductive substrate is larger than the adhesion between the overlying conductive substrate and the underlying conductive substrate. Thus, the robustness of the electronic device package can be further enhanced. The electronic device package may further include a different type of antenna structure disposed in the space to improve antenna performance and communication effect without extra space.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic device package, comprising:
   a first conductive substrate having a first coefficient of thermal expansion (CTE);
   a second conductive substrate disposed on an upper surface of the first conductive substrate and electrically connected to the first conductive substrate, the second conductive substrate having a second CTE, wherein the second conductive substrate comprises at least one first antenna structure; and
   a dielectric layer disposed on the upper surface of the first conductive substrate and disposed on at least one sidewall of the second conductive substrate, the dielectric layer having a third CTE, wherein a difference between the first CTE and the second CTE is larger than a difference between the first CTE and the third CTE.

2. The electronic device package of claim 1, wherein a first modulus of elasticity of the first conductive substrate is larger than a second modulus of elasticity of the second conductive substrate.

3. The electronic device package of claim 2, wherein a third modulus of elasticity of the dielectric layer is between the first modulus of elasticity and the second modulus of elasticity.

4. The electronic device package of claim 1, further comprising an adhesion layer between the first conductive substrate and the second conductive substrate.

5. The electronic device package of claim 1, wherein the dielectric layer surrounds the sidewalls of the second conductive substrate.

6. The electronic device package of claim 1, wherein the first conductive substrate comprises a communication substrate.

7. The electronic device package of claim 1, wherein the first antenna structure comprises a multi-band antenna structure.

8. The electronic device package of claim 1, further comprising at least one second antenna structure disposed in the dielectric layer.

9. The electronic device package of claim 8 wherein a sidewall of the second antenna structure is substantially coplanar with an edge of the dielectric layer.

10. The electronic device package of claim 1, further comprising a plurality of conductive structures disposed between the first conductive substrate and the second conductive substrate, and electrically connecting the first conductive substrate to the second conductive substrate.

11. The electronic device package of claim 1, further comprising an electronic component disposed on a lower surface of the first conductive substrate and electrically connected to the first conductive substrate.

12. The electronic device package of claim 11, further comprising an electrical contact disposed on the lower surface of the first conductive substrate and electrically connected to the first conductive substrate.

13. The electronic device package of claim 11, further comprising an encapsulation layer disposed on the lower surface of the first conductive substrate and encapsulating the electronic component.

14. An antenna device package, comprising:
   a substrate having a first surface and a second surface opposite to the first surface;
   at least one first antenna structure disposed on the first surface of the substrate, wherein a space is defined between the first surface of the substrate and a sidewall of the first antenna structure, and the space exposes a portion of the first surface of the substrate;
   a dielectric layer disposed in the space and in contact with the sidewall of the first antenna structure and the first surface of the substrate; and
   an electronic component disposed on the second surface of the substrate and electrically connecting with the first antenna structure through the substrate,
   wherein a difference between a coefficient of thermal expansion (CTE) of the substrate and a CTE of the at least one first antenna structure is larger than a difference between the CTE of the substrate and a CTE of the dielectric layer.

15. The antenna device package of claim 14, further comprising a second antenna structure disposed on the substrate and encapsulated by the dielectric layer.

16. The antenna device package of claim 14, further comprising an electrical contact disposed on the second surface of the substrate and electrically connected to the substrate.

17. The antenna device package of claim 14, further comprising an encapsulation layer disposed on the second surface of the substrate and encapsulating the electronic component.

18. The antenna device package of claim 14, wherein the dielectric layer comprises a molding compound and fillers.

19. An antenna device package, comprising:
- a conductive substrate including at least one first dielectric film having a first dielectric constant;
- an antenna structure disposed above the conductive substrate and electrically connected to the conductive substrate, the antenna structure including at least one second dielectric film having a second dielectric constant;
- an encapsulation layer above the conductive substrate, contacting a sidewall of the antenna structure, and exposing an upper surface of the antenna structure; and
- an adhesion layer between the conductive substrate and the antenna structure,
- wherein the second dielectric constant is smaller than the first dielectric constant.

* * * * *